United States Patent [19]

Nakazawa et al.

[11] Patent Number: 5,352,982
[45] Date of Patent: Oct. 4, 1994

[54] METHOD AND APPARATUS FOR DISPLAYING A RESIDUAL ELECTRIC CHARGE OF A BATTERY FOR AN ELECTRICALLY DRIVEN VEHICLE

[75] Inventors: Yoshihiro Nakazawa; Satoshi Honda; Hiroyuki Suzuki; Shigemi Sasaki, all of Saitama, Japan

[73] Assignee: Honda Giken Kogyo Kabushiki Kaisha, Tokyo, Japan

[21] Appl. No.: 767,650

[22] Filed: Sep. 30, 1991

[30] Foreign Application Priority Data

Oct. 16, 1990 [JP] Japan ................. 2-277263

[51] Int. Cl.⁵ .......................................... G01N 27/416
[52] U.S. Cl. ...................... 324/427; 324/433; 320/48; 340/636; 364/483
[58] Field of Search ................. 324/427, 431, 433; 320/48; 340/636; 364/483

[56] References Cited

U.S. PATENT DOCUMENTS

| | | | |
|---|---|---|---|
| 4,151,454 | 4/1979 | Iida | 320/48 |
| 4,333,149 | 6/1982 | Taylor et al. | 324/433 X |
| 4,390,841 | 6/1983 | Martin et al. | 324/427 |
| 4,394,613 | 7/1983 | Cole | 340/636 X |
| 4,558,281 | 12/1985 | Codd et al. | 324/433 |
| 4,595,880 | 6/1986 | Patil | 324/427 |
| 4,677,363 | 6/1987 | Kopmann | 320/44 |
| 4,709,202 | 11/1987 | Koenck et al. | 320/43 |
| 4,947,123 | 8/1990 | Minezawa | 324/427 |
| 4,977,393 | 12/1990 | Arnold et al. | 340/636 |
| 5,132,626 | 7/1992 | Limuti et al. | 324/432 |
| 5,144,218 | 9/1992 | Bosscha | 320/44 |

FOREIGN PATENT DOCUMENTS

| | | |
|---|---|---|
| 3218148 | 11/1983 | Fed. Rep. of Germany . |
| 3321045 | 12/1983 | Fed. Rep. of Germany . |
| 3321649 | 12/1983 | Fed. Rep. of Germany . |
| 3311723 | 10/1984 | Fed. Rep. of Germany . |
| 3429145 | 2/1985 | Fed. Rep. of Germany . |
| 3823038 | 1/1990 | Fed. Rep. of Germany . |
| 50-45628 | 5/1975 | Japan . |
| 177001 | 2/1991 | Japan . |

Primary Examiner—Kenneth A. Wieder
Assistant Examiner—Glenn W. Braun

[57] ABSTRACT

In a method and apparatus for displaying a residual electric charge for a battery of an electrically driven vehicle, the battery's capacity is detected after the battery is charged. This information is utilized by a residual electric charge meter to indicate a fully charged state of the battery. As the battery begins to supply current to the electric loads, dissipated power is calculated from the product of the value of the current and the length of time during which the current has been supplied. This calculated dissipated power is subtracted from the fully charged capacity from time to time in order to derive the residual electric charge. The battery residual electric charge meter is driven in accordance with the derived value to indicate a current residual electric charge. As such, the battery residual electric charge meter displays values which depend upon the actual fully charged capacity and a residual charge.

1 Claim, 6 Drawing Sheets

METHOD AND APPARATUS FOR DISPLAYING A RESIDUAL ELECTRIC CHARGE OF A BATTERY FOR AN ELECTRICALLY DRIVEN VEHICLE

BACKGROUND OF THE PRESENT INVENTION

The present invention relates to a method and apparatus for displaying a residual electric charge in a battery used for an electrically driven vehicle.

DESCRIPTION OF THE PRIOR ART

Electrically driven vehicles use batteries as the source of power for driving the motor. Since the distance which an electrically driven vehicle can travel depends on the residual electric charge of its battery, it is necessary for the electrically driven vehicle to have a battery residual electric charge meter which constantly displays the present actual residual electric charge. A typical battery residual electric charge meter has been disclosed in Published Japanese Patent Application 50-45628.

When using conventional technology, a shunt is connected in series with the battery and a direct current motor is connected in parallel with the shunt. A movable needle is coupled to the direct current motor through a friction joint. This needle is equipped with a device which moves a needle using a slip relative to the motion of the direct current motor.

When the battery is being charged, current flows from the charging device to the battery, thereby causing the direct current motor to rotate in a certain direction and the needle to swing to indicate a charging process. On the other hand, when current is being supplied to the battery's loads, such as an electric motor, the direct current motor rotates in the opposite direction, thereby causing the needle to swing to indicate a discharging process by an angle proportional to the electric power dissipated by the battery.

When the needle of the battery residual electric charge meter is swinging toward the charging direction during a charging operation, the movement of the needle can be halted at a predetermined position using a stopper device such that a fully charged battery is indicated even if the charging process is still going on. On the other hand, the needle may not reach the predetermined halt position described above, even if the charging of the battery is completed. However, in this case, a reset device can be used to forcibly swing the needle to the predetermined halt position which indicates a fully charged state.

Utilizing the conventional technology described above, the movement of the needle can be halted by the stopper to indicate a fully charged state even if the charging operation is still going on. Such a situation incorrectly indicates to the user that the battery is fully charged. In addition, the needle may also not swing to the predetermined halt position upon the completion of the charging. This situation also incorrectly informs the user that the battery is not fully charged although as noted above, the charging of the battery has been completed. These incorrect indications demonstrate a discrepancy between the electric charge actually left in the battery and the residual electric charge indicated by the meter.

Since, as described earlier, the distance which an electrically driven vehicle can travel depends on the residual electric charge of the battery, the discrepancy noted above can cause serious problems in the actual operations of the electrically driven vehicle. Due to the presence of this discrepancy, the user of the electrically driven vehicle would be incorrectly informed of the actual distance which the electrically driven vehicle can travel because the visual information indicating the residual electric charge of the battery would be incorrect.

Moreover, the actual capacity of the battery at the time of charging gradually decreases over the course of time. More specifically, the charging and discharging of the battery contributes to the decrease in the actual capacity of the battery. Accordingly, the above described phenomena can actually result in an even more serious problem due to the increasing capacity of the battery over time. This discrepancy between the actual electric charge left in the battery and the residual electric charge indicated to the user through the residual electric charge meter should be eliminated to enable an electrically driven vehicle to be operated reliably.

OBJECTS OF THE PRESENT INVENTION

It is an object of the present invention to eliminate the problems discussed above with respect to the discrepancy between the actual electric charge left in the battery and the residual electric charge indicated to a user of an electrically driven vehicle.

It is a further object of the present invention to provide a residual electric charge meter which indicates the actual electric charge left in a battery for an electrically driven vehicle.

It is still further an object of the present invention to provide a residual electric charge meter which compensates the capacity of the fully charged battery based on the actual temperature of the battery such that the actual residual electric charge is correctly indicated.

It is still another object of the present invention to provide a residual electric charge meter which compensates for the diminished capacity of the battery due to repetitive charging and discharging of the electric battery.

SUMMARY OF THE PRESENT INVENTION

The present invention provides an apparatus and method for displaying the actual battery residual electric charge for an electrically driven vehicle which substantially eliminates the discrepancies discussed above.

A method for displaying the residual electric charge in the battery is characterized in that the fully charged capacity of the battery is measured at the end of the charging process of the battery. This method calculates the power dissipated by the battery based on the current supplied to the electrical loads of the electrically driven vehicle. The calculated dissipated power is then subtracted from the fully charged capacity to determine the actual battery residual electric charge. The present invention utilizes a battery residual electric charge meter which is driven in accordance with the determination of the actual battery residual electric charge.

Another preferred embodiment of the present invention displays the residual electric charge in the battery utilizing the various processes described above. However, in this preferred embodiment of the present invention, the measurement of the capacity of the fully charged battery is performed after a predetermined period of time has elapsed since the end of the charging process of the battery.

In still another preferred embodiment of the present invention, the present invention displays a residual electric charge for a battery utilizing all the processes described in the first preferred embodiment. However, in this preferred embodiment of the present invention, after the capacity of the fully charged battery is measured, this measurement is compensated based on the temperature of the battery. This compensation based on the temperature of the battery allows a more precise measurement of the actual capacity of the charged battery.

A fourth embodiment of the present invention utilizes the various processes described above in the first preferred embodiment of the present invention to display a residual electric charge of a battery. However, in this preferred embodiment of the present invention, the measurement of the fully charged capacity of the battery is carried out by comparing an electric charge discharged from the battery during a predetermined period of charge-consumption time to a predetermined reference discharge characteristic.

BRIEF DESCRIPTION OF THE DRAWINGS

The present invention will become more fully understood from the detailed description given below and the accompanying drawings which are given by way of illustration only, and thus are not limitative of the present invention, and wherein.

DETAILED DESCRIPTION OF THE PRESENT INVENTION

Figure 1:
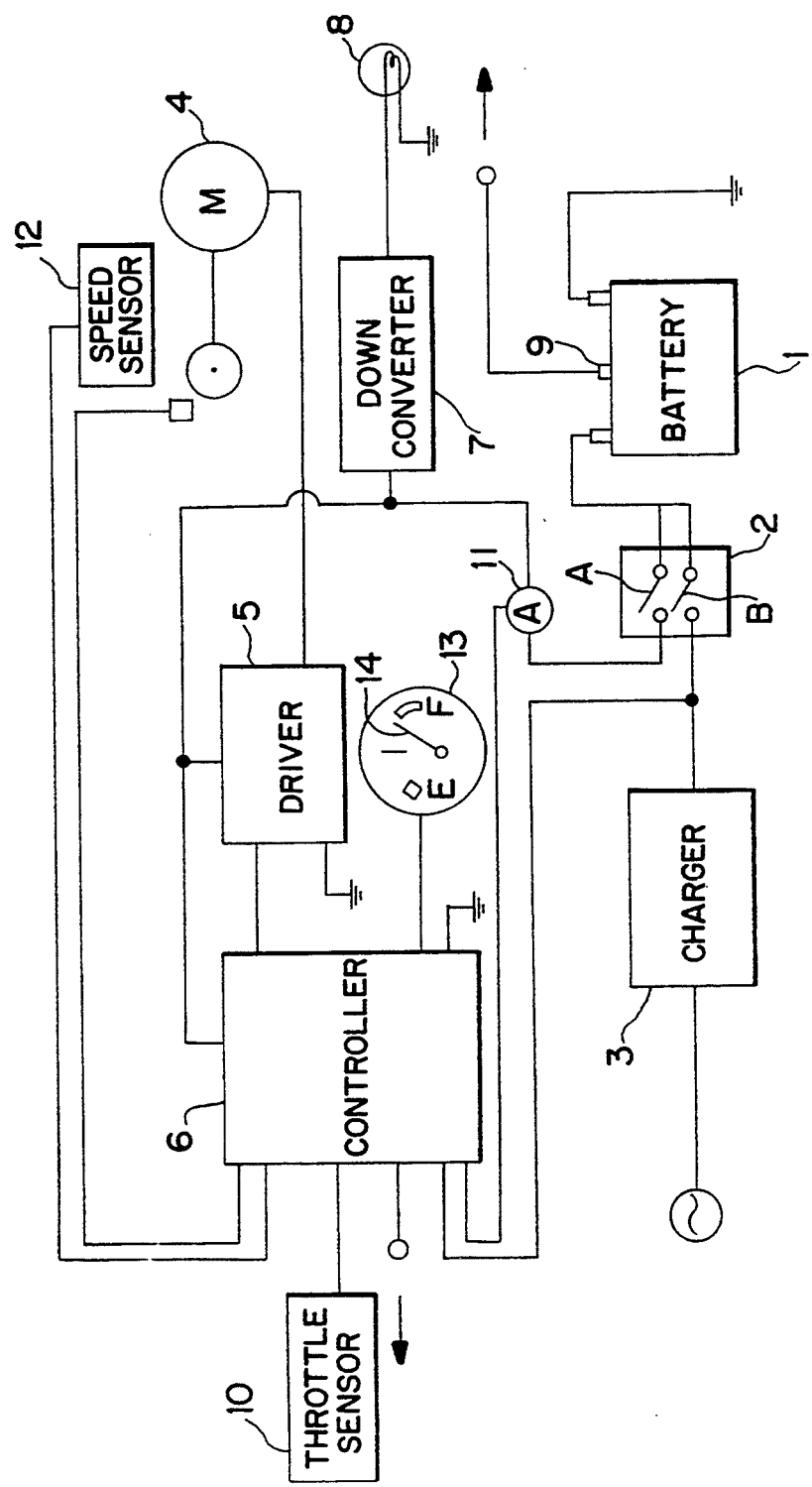
FIG. 1 is a block diagram of a control system for an electrically driven vehicle which utilizes the present invention.

In the drawings, like reference numerals designate like parts throughout the drawings.

Referring to FIGS. 1–7, a first embodiment of the present invention is described as follows.

FIG. 1 shows a block diagram of an apparatus implementing the concepts of the present invention as adopted by one embodiment of the present invention. Battery 1 is used to drive the electrically driven vehicle. Battery 1 is connected to a combination switch 2 such that the combination switch 2 is connected to the positive terminal of the battery 1. The combination switch 2 includes a driving switch A and a charging switch B.

A charger 3 is connected to the charging switch B of the combination switch 2. When electrically charging the battery 1 via the charger 3, the charging switch B is turned on such that the charger 3 is connected directly to the positive terminal of battery 1. On the other hand, when the electric charging of the battery 1 is completed, the charging switch B is automatically turned off.

Although FIG. 1 illustrates that the charging switch B is included in the combination switch 2, an alternative embodiment may include the charging switch B actually in the charger 3.

The actual position of the charging switch B is not critical. It is only essential that the switch B turns off at the end of the electric charging process.

The driving switch A is connected to a driver 5 which controls the current supplied to an electric motor 4 and a controller 6. The controller 6 is connected to the driver 5 such that controller 6 controls the operations of the driver 5. The driving switch A is also connected to an electric load such as an igniter 8 through a down converter 7.

The controller 6 is electrically connected to a temperature sensor 9 which is mounted on the battery 1. The controller is also connected to a throttle sensor 10 which detects the position of a throttle. The throttle adjusts the speed of the electrically driven vehicle. An amp meter 11 is connected to the controller 6 for measuring the driving current supplied to the igniter 8. The controller is also connected to a speed sensor 12 which monitors the rotational speed of the electric motor 4. Lastly, the controller 6 is connected to a battery residual electric charge meter 13 which displays the residual electric charge in the battery 1.

Figure 2:
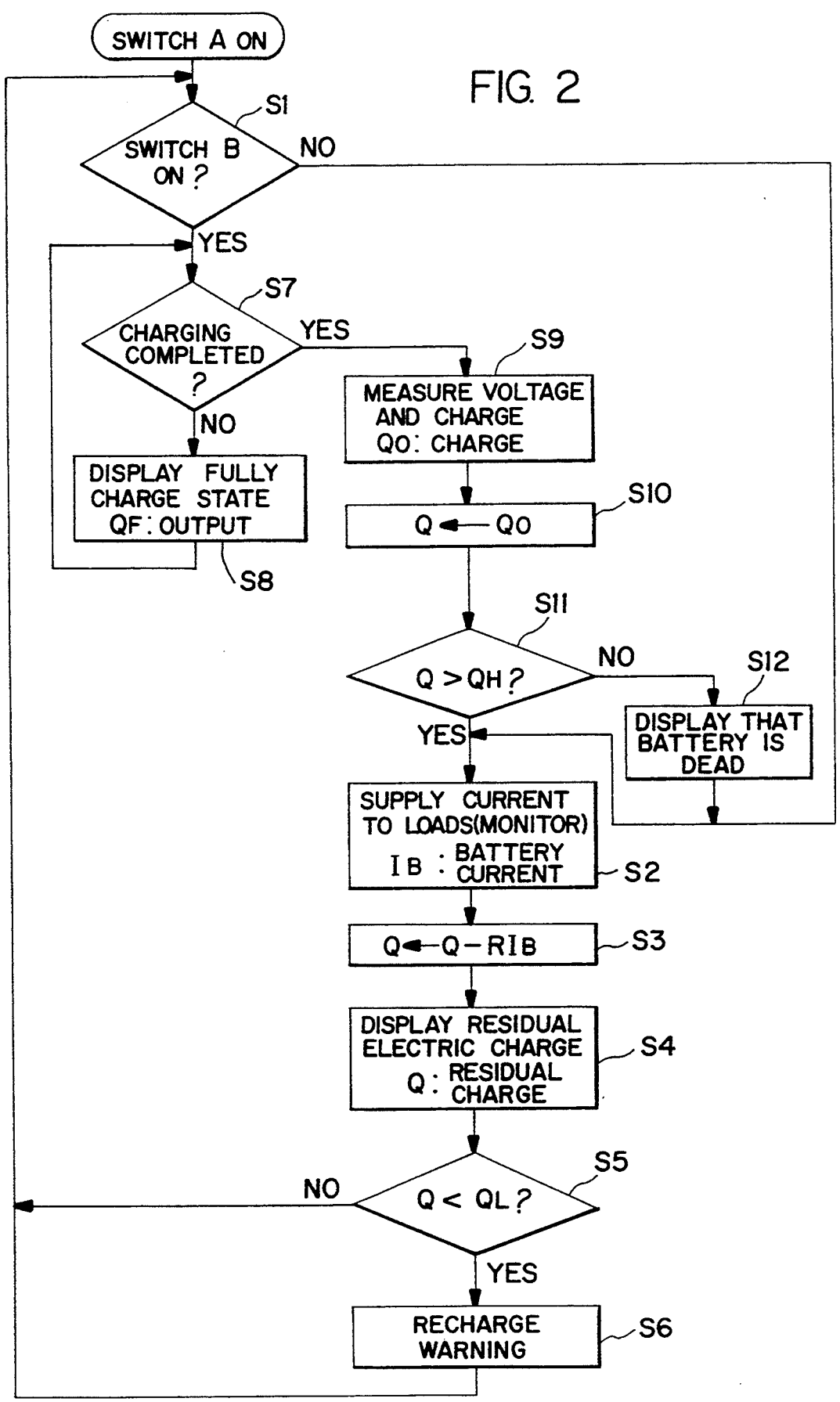
FIG. 2 is a flowchart illustrating a first embodiment of the present invention.

The apparatus illustrated by FIG. 1, and described above, carries out the process illustrated in the flowchart of FIG. 2. In FIG. 2, it is assumed that the electrically driven vehicle starts running with a fully charged battery 1.

The process illustrated in the flowchart of FIG. 2 is commenced when the driving switch A is turned on to supply an electric current from the battery 1 to the electric loads of the electrically driven vehicle, such as the igniter 8 and the electric motor 4.

According to the flowchart of FIG. 2, step S1 checks whether the charging switch B is turned on or off. The process goes to step S2 only if the charging switch B is turned off. At step S2, driving current is supplied to the electric motor 4, igniter 8, etc. from the battery 1. Thus, at step S2, the electric charge stored in the battery 1 is gradually consumed by the electrical loads.

At step S2, the battery current I, the electrical driving current supplied to the electrical loads, is continuously monitored through a signal coming from the amp meter 11 which is connected in series with the path of the electrical driving current flowing from the battery 1. At the same time, the controller 6 measures the length of time, t, for which the driving current is supplied. After measuring the length of time the driving current is applied to electrical loads, the process continues at step S3. At step S3, the battery current $I_B$ and the supply time t measured in the step S2 are used to compute the dissipated power (diminished capacity) $R*I_B$ wherein R is the total resistance of the electrical loads. The dissipated power $(R*I_B^2)$ is subtracted from the battery's residual electric charge Q to give a new battery residual charge Q′ which is stored as an updated value. The process then continues to step S4.

At step S4, the controller 6 provides the battery residual electric charge meter 13 with a driving signal based on the information stored as the updated residual electric charge Q' computed during step S3. Upon receiving the driving signal, the battery residual electric charge meter 13 displays information corresponding to the battery's residual electric charge Q'. The process then continues to step S5.

At step S5, the residual charge, Q', updated during the execution of step S3 is compared with a lower limit, $Q_L$, a predetermined charge limit under which the battery should not be used. If the residual electric charge, Q' is equal to or greater than the lower limit $Q_L$, the residual charge in the battery 1 is determined to be sufficient enough for driving use, and the process returns to step S1. If the residual electric charge Q' is smaller than the lower limit $Q_L$, the process proceeds to step S6. At step S6, when the residual electric charge Q' becomes smaller than the lower limit, $Q_L$, it is determined that the battery 1 should not provide any further power to run the electric driving vehicle. When this situation is determined, a display device, such as a warning lamp, is activated to notify the driver that the battery 1 needs to be recharged. The process then returns to step S1.

In the preferred embodiment of the present invention, the charge lower limit $Q_L$ is set at 60% of the total charged capacity of the battery 1.

Figure 3:
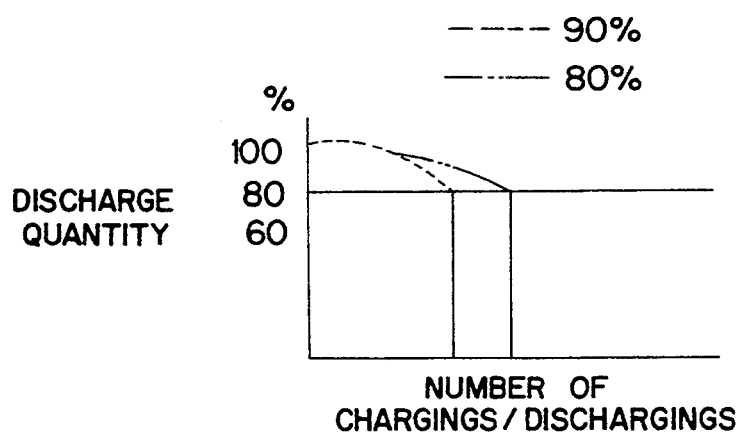
FIG. 3 illustrates a relationship between the discharge amount and the number of charging and discharging times or different discharge rates.

FIG. 3 illustrates a comparison study based on the way the battery 1 can be utilized. In one scenario, the battery 1 is used at a discharge rate in the range of 80% to 100% or at an average discharge rate of 90%. In another situation, the same battery 1 is utilized at an average discharge rate of 80%. In utilizing the average discharge rate of 90%, it is possible to consume 80% of the initial charge by discharging and recharging the battery 1 much fewer times than when utilizing the average discharge rate of 80%. This difference is clearly illustrated in FIG. 3. In other words, the total charge that could be dissipated by the battery 1 for an average discharge rate of 90%, is smaller than the dissipation of the battery 1 at an average discharge rate of 80%.

Furthermore, when the warning lamp is turned on, it will take some time to drive the vehicle to a station where the battery can be actually recharged. In the preferred embodiment of the present invention, the charge lower limit $Q_L$ is set at 60%, based on the assumption that in order to drive the vehicle to a recharging station, the process would require 20% of the battery's capacity.

Figure 5:
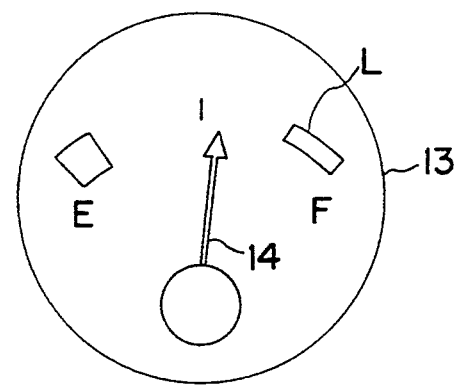
FIG. 5 illustrates a front view of a battery residual electric charge meter.
Figure 6:
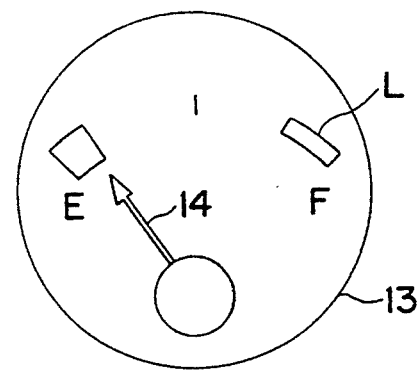
FIG. 6 illustrates a front view of the battery residual electric charge meter.

Different display states of the battery residual electric charge meter 13 controlled by the preferred embodiment of the present invention are shown in FIGS. 5 and 6. FIG. 5 illustrates a needle position indicating that the residual charge Q is greater than the charge lower limit, $Q_L$, whereas FIG. 6 shows a needle point position indicating a residual charge Q smaller than the charge lower limit, $Q_L$.

If the charging switch B is turned on at step S1, the battery 1 is determined to be in a state of being charged. In such a situation, the process illustrated in FIG. 2 proceeds to step S7 and the subsequent steps.

At step S7, the process determines whether the electric charging has been completed or not. If the charging process has not been completed, the control process proceeds to step S8. On the other hand, if the charging process is complete, the control process proceeds to step S9. In the preferred embodiment of the present invention, the completion of the electric charging is determined by the state of the charging switch B. In other words, the charging switch B is turned off upon the completion of the electric charging of the battery 1.

At step S8, a driving signal is transmitted to the battery residual electric charge meter 13 to indicate that the battery 1 is being charged. Upon the transmission of this driving signal, the control process returns to step S7.

At step S9, when the electric charging of the battery 1 is determined to be completed at step S7, the voltage and the full charge $Q_0$ of the battery 1 are measured. Correction based on temperature information of the battery 1 obtained from a temperature sensor 9 is then performed. Upon completion of this correction process, the control process proceeds to step S10.

At step S10, the full charge $Q_0$ measured and corrected at step S9 is stored as an updated initial Q'. Upon the storing of this information, the control process proceeds to step S11.

At step S11, the initial charge Q' is compared to a minimum full charge $Q_H$ which is predetermined. If the initial charge Q' is greater than the minimum full charge $Q_H$, the control process proceeds to step S2. On the other hand, if the initial charge Q' is less than the minimum full charge $Q_H$, the control process proceeds to step S12.

At step S12, when the initial charge Q' is smaller than the minimum full charge $Q_H$, the initial charge Q' is determined to be insufficient for driving the vehicle. When such a determination is made, the battery 1 is deemed no longer usable, and the residual electric charge meter 13 indicates to the user this information accordingly. The control process then continues to step S2.

Figure 7:
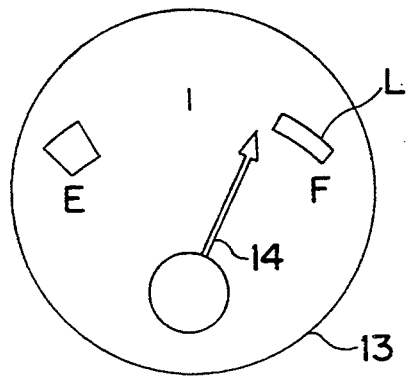
FIG. 7 illustrates a front view of the battery residual electric charge meter.

In the preferred embodiment of the present invention, the ended life of the battery 1 is indicated by utilizing a life zone L as illustrated in FIG. 7. The life zone L corresponds to the minimum full charge $Q_H$ which can be indicated by a position of the needle 14. The ended life of the battery 1 is indicated by placing the needle 14 beyond the life zone L.

Figure 4:
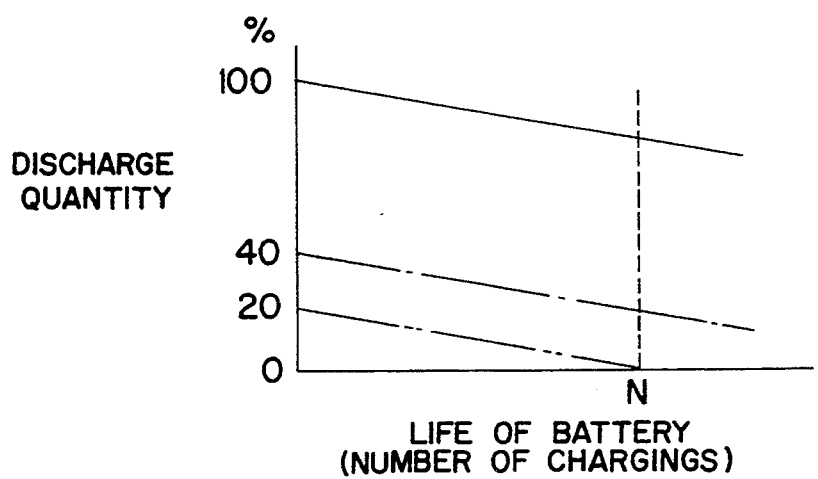
FIG. 4 illustrates a relationship between the discharge amount and the number of charging times.

When usage is set to limit the discharge quantity within 80%, the number of times N a discharging can be performed is derived theoretically from the illustration of FIG. 4. Inversely, for a given value of the number of times N a discharging can be performed, the usage determining the discharged quantity limit can be set. As such, according to the method for displaying a residual electric charge of the battery 1 adopted by the preferred embodiments of the present invention, a full charge $Q_0$ of the battery 1, immediately after electric charging, is directly measured and displayed by the battery residual electric charge meter 13. A discharged quantity is monitored and subtracted from the full charge $Q_0$ to give an updated charge, Q', which is used to drive the battery residual electric charge meter 13. Subsequently, the monitoring of a discharge quantity and the subtraction to obtain the updated charge Q' are carried out continuously to give a new updated value, Q', which, in turn, maintains the display of the battery residual electric charge meter 13 updated at all times. The display of the battery residual electric charge meter 13 substantially indicates the electric charge that is actually left in the battery 1. Accordingly, the residual electric charge in the battery 1 can be indicated very accurately via a visual information device.

Since this preferred embodiment of the present invention implements temperature correction upon the initially measured full charge $Q_0$ of the battery 1, the full charge $Q_0$ can be determined in a more accurate manner. Furthermore, since the display of the battery residual electric charge meter 13 is based on the corrected value of the full charge $Q_0$, the correction and the displayed information can be carried out more easily and reliably.

The full charge $Q_0$ is compared to a minimum full charge $Q_H$ to identify the current life expectancy of the battery. Therefore, the time to replace the battery 1 can be readily determined.

Figure 8:
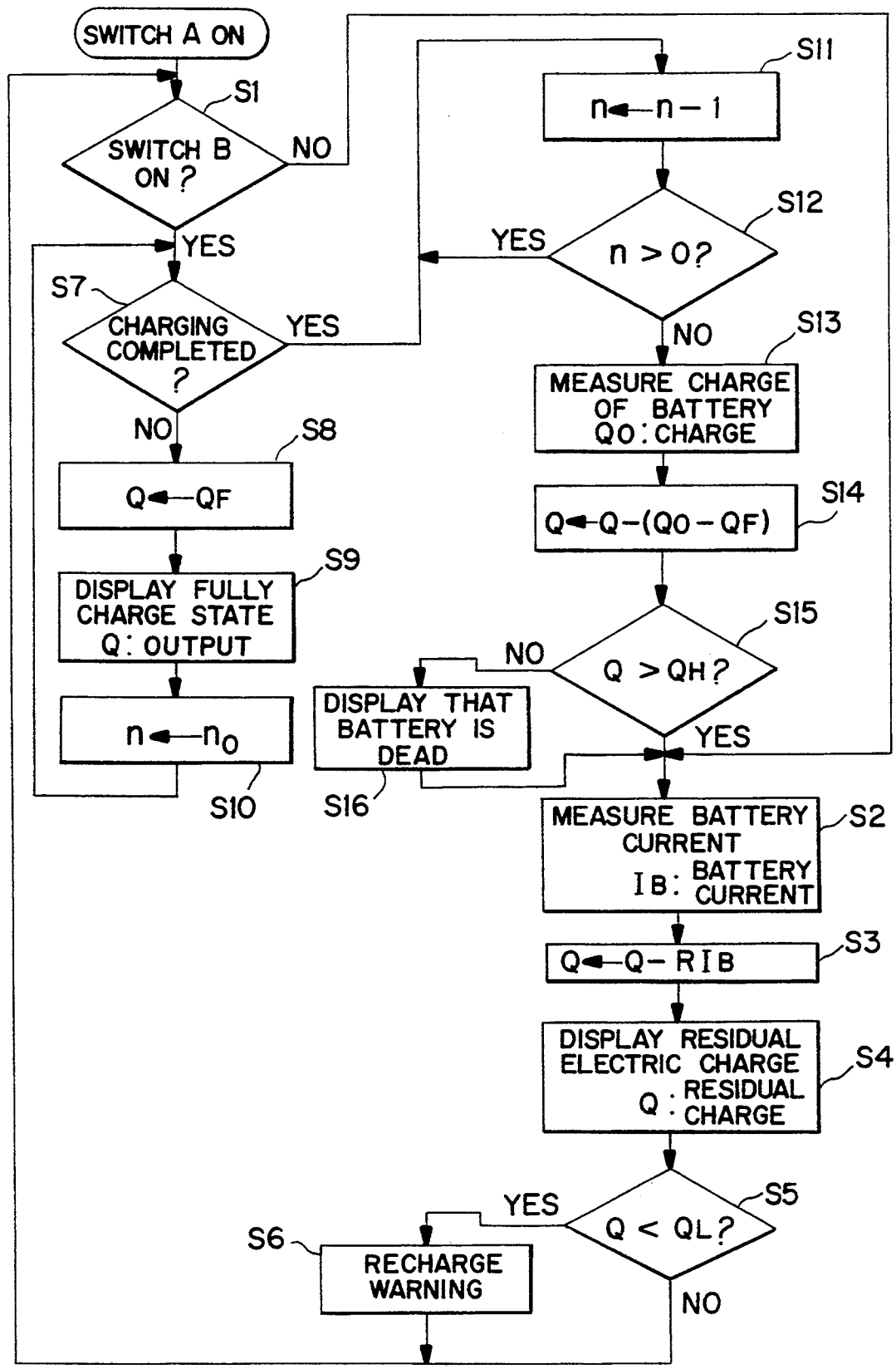
FIG. 8 is a flowchart which illustrates a second embodiment of the present invention.

A second preferred embodiment of the present invention will be explained utilizing FIG. 8. FIG. 8 illustrates a control process utilized to carry out the second preferred embodiment of the present invention.

At step S1 of FIG. 8, the control process determines whether the charging switch B is turned off or on. The control process then continues to step S2 only if the charging switch B is turned off.

At step S2, a signal from the amp meter 11 is used to continuously monitor the driving current $I_B$ provided by the battery 1. The controller 6 also measures a period of time during which the driving current $I_B$ is provided before the control process proceeds to step S3.

At step S3, the battery current $I_B$ and the supply time t are used to compute the dissipated power (capacity) $R*I_B^2$. The dissipated power $R*I_B^2$ is subtracted from a battery residual electric charge Q to produce a new battery residual electric charge Q' which is stored as an updated value. Upon the completion of this determination, the control process proceeds to step S4. The new electric charge Q' is the battery's residual electric charge Q at this point of time.

At step S4, the controller 6 provides the battery residual electric charge meter 13 with a driving signal based on the information of the updated residual electric charge Q' of the battery 1 computed at step S3. Upon receiving the driving signal, the battery residual electric charge meter 13 displays information corresponding to the battery's residual electric charge Q'. Upon displaying this information, the control process proceeds to step S5.

At step S5, the residual electric charge Q' is compared to a lower limit $Q_L$. The lower limit $Q_L$ is predetermined and corresponds to a level under which the battery should no longer be used. If the residual electric Q' is equal to or greater than the lower limit $Q_L$, the residual charge in the battery 1 is determined to be sufficient enough for driving use, and the control process returns to step S1. If the residual electric charge Q' is smaller than the lower limit $Q_L$, the control process proceeds to step S6.

At step S6, when the residual electric charge Q' becomes smaller than the charge lower limit $Q_L$, it is determined that the battery 1 should no longer provide power to run the electrically driven vehicle. When such a determination is made, a display device, such as a warning lamp, is activated to notify the driver that the battery 1 needs to be recharged. The control process then proceeds to step S1.

If the charging switch B is found to be turned on at step S1, the battery 1 is determined to be in a state of being charged. When the battery 1 is being charged, the control process goes to step S7 in the subsequent steps thereafter.

At step S7, it is determined whether the electric charging process has been completed or not. If the electric charging process has not been completed, the control process continues to step S8.

At step S8, the residual electric charge Q is stored as a full charge $Q_F$, and the control process proceeds to step S9.

At step S9, the battery residual electric charge meter 13 is driven by a signal based on information of the full electric charge $Q_F$ to display the charging information. The control process then proceeds to step S10.

At step S10, an initial value $n_0$ is stored as a counter value, and the control process returns to step S7.

At step 11, when the electric charging process is determined to be complete at step S7, the counter value n is decremented by 1, such that the value n-1 is stored as the new counter value. The control process then proceeds to step S12.

At step S12, the updated counter value is compared to 0 (zero). If n is equal to or smaller than 0, the control process proceeds to step S13. On the other hand, if n is greater than 0, the control process returns to step S11.

Steps S11 and S12 utilize a counter to delay the transition from step S7 to step S13 by a length of time which is proportional to the initial value $n_0$ of the counter stored at step S10.

At step S13, the voltage and the full electric charge $Q_0$ of the battery 1 are measured, and the full electric charge $Q_0$ is corrected using information based on the temperature of the battery obtained from a temperature sensor 9. The control process then proceeds to step S14.

At step S14, residual charge Q' is computed using the following formula:

$$Q-(Q_F-Q_0)$$

where Q is the electric charge Q' updated at step S8, $Q_0$ is a full electric charge measured and corrected at step S13, and $Q_F$ is the maximum full electric charge. The computed residual electric charge is stored and the control process proceeds to step S15.

The above formula subtracts the difference between the maximum full electric charge $Q_F$ and the measured full electric charge $Q_0$ from the residual electric charge Q to give an actual residual electric charge.

At step S15, the residual electric charge Q' is compared to a minimum full electric charge $Q_H$ which is predetermined. If the residual electric charge Q' is larger than the minimum electric charge $Q_H$, the control process proceeds to step S2. On the other hand, if the residual electric charge Q' is lower than the minimum electric charge $Q_H$, the control process proceeds to step S16.

At step S16, when a residual electric charge Q' is smaller than the minimum electric charge $Q_H$, this determination is indicated by the battery residual electric charge meter 13. The control process then returns to step S2.

According to the method for displaying a residual electric charge of the battery 1 utilized in this preferred embodiment of the present invention, the full electric charge $Q_0$ is measured at a predetermined time after completion of the electric charging process. The time between the completion of the electric charging process and the actual measurement is set by the step S10 to S13. Accordingly, the full electric charge $Q_0$ is measured after the battery 1 has entered a stable state. As a result, the full charge can be measured more accurately.

Figure 9:
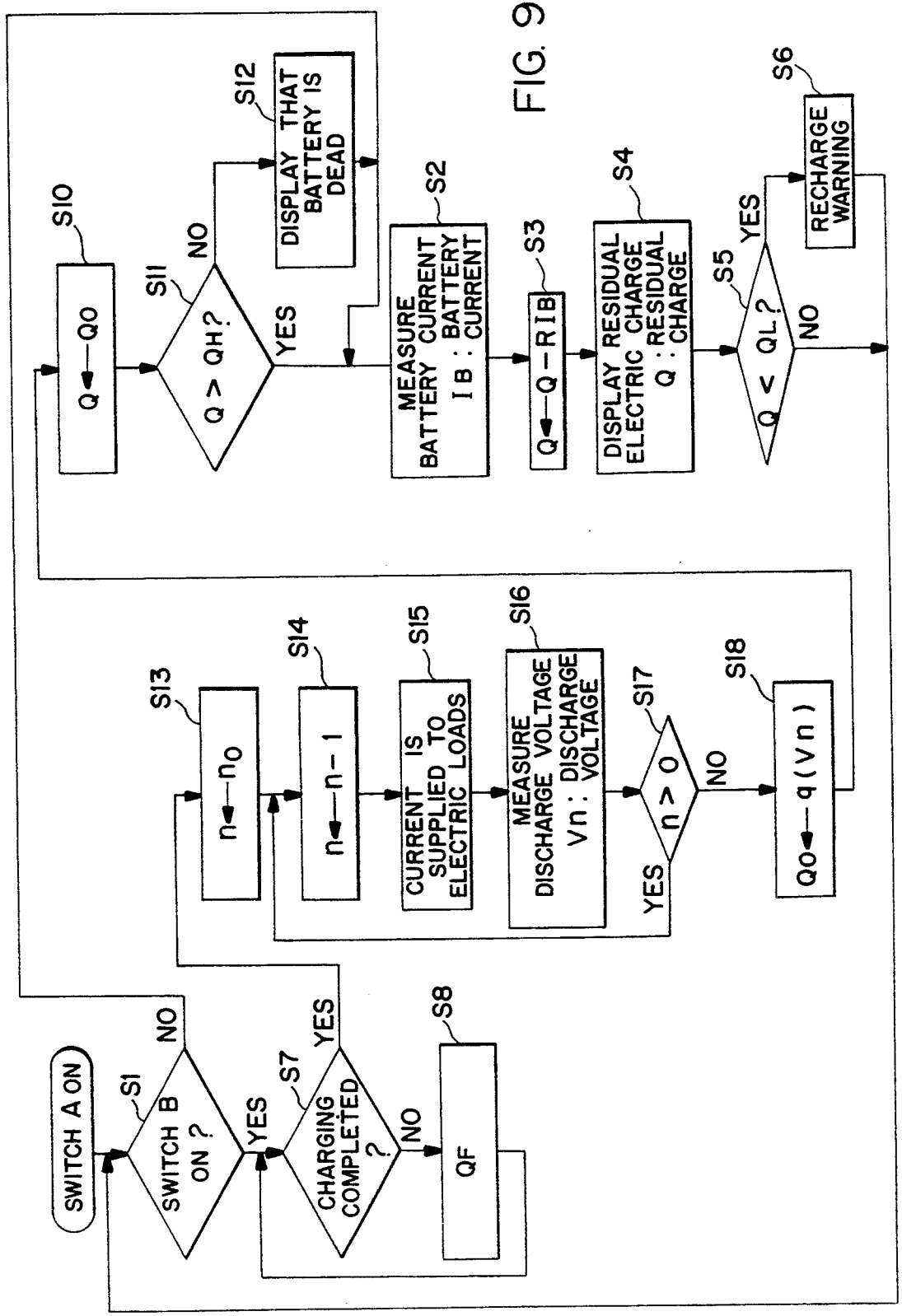
FIG. 9 is a flowchart which illustrates a third embodiment of the present invention.

FIG. 9 illustrates another preferred embodiment of the present invention. In this embodiment of the present invention, steps S1 to S7 and steps S10 to S12 are the same as the corresponding steps described in the first embodiment of the present invention. However, step S9 of the first embodiment of the present invention is changed in the following manner.

At step S13, when the electric charging process is determined to be completed at step S7, the counter value n is set to a predetermined value $n_0$ and stored. The control process then continues to step S14.

At step S14, the counter value n is decremented by 1 and stored. The control process then proceeds to step S15. At step S15, current is allowed to flow for a predetermined period of time, for example a few seconds, through the igniter 8, etc., which serve as resistors across both terminals of the battery 1. The control process then proceeds to step S16.

At step S16, a discharge voltage $V_N$ is measured and stored at the same time that the process is carried out at step S15. The control process then continues to step S17.

At step S17, the counter value n is compared to 0 (zero). If the counter value n is equal to or smaller than 0, the control process continues to step S18. On the other hand, if the counter value n is greater than 0, the control process returns to step S14. Like the second embodiment of the present invention, steps S13, S14, and S17 constitute a counter (delay).

At step S18, the battery voltage $V_N$ measured at step S16 is corrected due to temperature before being compared to a predetermined discharge characteristic to determine a corresponding full charge q. The full charge q is stored as a full charge Q. The control process then continues to step S10 and the subsequent steps. The discharge voltage of a fully charged battery varies proportionately to the saturation capacity of the battery 1 with a full charge. Thus, the amount of capacity which has deteriorated can be derived accurately by comparing a discharge voltage to a predetermined discharge characteristic according to the method utilized in the preferred embodiment of the present invention. As a result, the charge actually left in the battery 1 can be displayed immediately on the battery residual electric charge meter 13.

Figure 10:
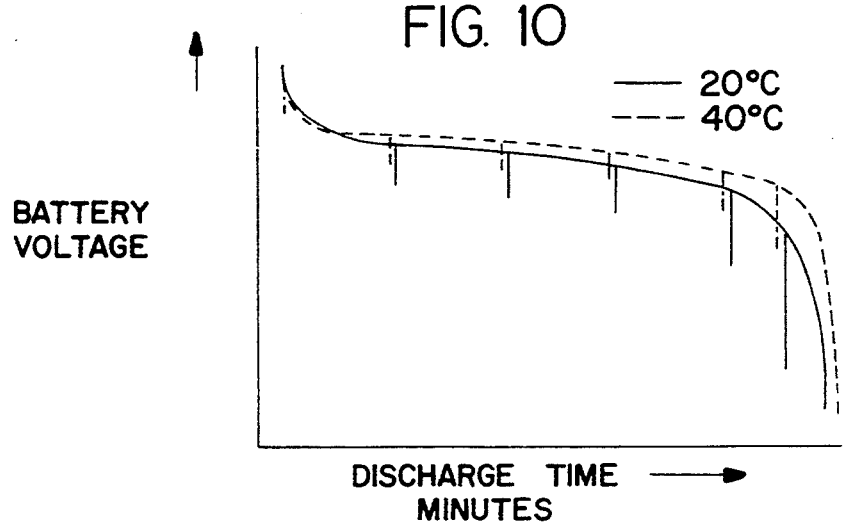
FIG. 10 illustrates the relationship between the battery voltage and the discharge time.

It should be noted that the embodiments described above are no more than preferred examples of the present invention. The control procedures can thus be changed in accordance with a variety of design requirements. For example, the third embodiment in which a full charge is derived by comparing a discharge voltage to a predetermined discharge characteristic has been described. However, the discharge voltage changes with discharge time as shown in FIG. 10. Accordingly, by performing this process at the time the driving switch A is turned on, the residual electric charge can be initialized when the vehicle starts running at a time the battery 1 is not being charged.

The method for displaying a residual electric charge for a battery is characterized in that the fully charged capacity of the battery is initially measured at the end of the charging process of the battery. The calculation of the dissipated power is based on the current supply to the electric loads of the electrically driven vehicle. The calculated dissipated power is then subtracted from the fully charged capacity to determine a battery residual electric charge such that a battery residual electric charge meter can correctly indicate the battery's residual electric charge. In other words, the battery residual electric charge meter can actually provide the driver with information concerning the residual electric charge of the battery or distance that can be driven by the electric vehicle. Moreover, the time for recharging the battery can also be accurately indicated by the residual electric charge meter.

The method for displaying a residual electric charge for a battery is also characterized in that the measurement of the fully charged capacity of the battery is performed after a predetermined time has elapsed since the completion of the actual charging of the battery. As a result, errors in the measurement of the battery's residual electric charge can be further reduced and the displaying of the battery's residual electric charge can be made more reliable.

The method for displaying a residual electric charge for a battery is further characterized in that after the fully charged capacity of the battery is measured by detecting the voltage of the battery, this voltage can be compensated based on the temperature of the battery. As a result, the actual capacity of the battery right after the electric charging process can be measured very accurately and the display of the battery's residual electric charge can be more reliable.

The method for displaying a residual electric charge for a battery is still further characterized in that the measurement of the fully charged capacity of the battery is performed by comparing an electric charge discharged from the battery during a predetermined period of time to a referenced discharge characteristic. Accordingly, the battery's residual electric charge can be determined by the difference between the reference battery electric charge and the actual charge. This determination provides information on the actual life of the battery. As a result, the appropriate time to replace the battery can be properly identified in advance.

By only certain embodiments of the present invention being described, it will be apparent to those skilled in the art that various changes and modifications may be made therein without departing from the spirit and scope of the present invention as set forth in the claims below.

What is claimed is:

1. An apparatus for determining a residual electric charge of a battery for an electrically driven vehicle comprising:

measuring means for initially measuring a charge capacity of the battery after completion of a charging operation;

calculation means for calculating power dissipated by the battery;

control means, operatively connected to said measuring means and said calculation means, for determining a residual electric charge of the battery from a difference between the measured charge capacity and the calculated dissipated power; and display means, operatively connected to said control means, for displaying said residual electric charge of the battery, said control means comparing said residual electric charge to a predetermined lower limit and disabling power supply from the battery to the electrically driven vehicle when said residual electric charge is lower than said predetermined lower limit.

* * * * *